US007697361B2

(12) United States Patent
Lee et al.

(10) Patent No.: US 7,697,361 B2
(45) Date of Patent: Apr. 13, 2010

(54) APPARATUS FOR ELECTRICAL FUSE OPTION IN SEMICONDUCTOR INTEGRATED CIRCUIT

(75) Inventors: Yun-Woo Lee, Suwon-si (KR); Kyu-Taek Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 516 days.

(21) Appl. No.: 11/799,842

(22) Filed: May 3, 2007

(65) Prior Publication Data

US 2008/0001252 A1   Jan. 3, 2008

(30) Foreign Application Priority Data

Jun. 30, 2006   (KR) ...................... 10-2006-0060987

(51) Int. Cl.
*G11C 17/18* (2006.01)
(52) U.S. Cl. ...................................... 365/225.7; 365/90
(58) Field of Classification Search .................. 365/96, 365/225.7; 257/50, 529, 530
See application file for complete search history.

(56) References Cited

U.S. PATENT DOCUMENTS

| 4,935,645 | A | * | 6/1990 | Lee ............................. 327/88 |
| 6,151,238 | A | * | 11/2000 | Smit et al. .................... 365/96 |
| 6,292,422 | B1 | | 9/2001 | Pitts |
| 6,590,414 | B2 | * | 7/2003 | Signorelli et al. ............. 326/37 |
| 6,624,499 | B2 | * | 9/2003 | Kothandaraman et al. ... 257/529 |
| 6,697,296 | B2 | * | 2/2004 | Matsumoto et al. .... 365/189.16 |
| 6,747,481 | B1 | * | 6/2004 | Pitts ............................ 326/41 |
| 7,049,986 | B1 | * | 5/2006 | Jones .......................... 341/121 |
| 7,295,057 | B2 | * | 11/2007 | Bhushan et al. ............. 327/525 |
| 2002/0191480 | A1 | * | 12/2002 | Matsumoto et al. ......... 365/233 |
| 2006/0087001 | A1 | * | 4/2006 | Kothandaraman et al. ... 257/529 |
| 2006/0108662 | A1 | * | 5/2006 | Kothandaraman et al. ... 257/528 |

FOREIGN PATENT DOCUMENTS

| KR | 1997-0051366 | 7/1997 |
| KR | 20010086506 A | 9/2001 |

OTHER PUBLICATIONS

C. Kothandaraman, et al., "Electrically Programmable Fuse (eFUSE) Using Electromigration in Silicides", Sep. 2002, IEEE Electron Device Letters, vol. 23 No. 9, pp. 523-525.*

* cited by examiner

*Primary Examiner*—Son Dinh
*Assistant Examiner*—Harry W Byrne
(74) *Attorney, Agent, or Firm*—Mills & Onello, LLP

(57) ABSTRACT

Provided is a fuse option device in a semiconductor integrated circuit. In the fuse option device, a pad receives an external fuse program signal, a program signal driving circuit is connected to the pad through a signal line and generates a program activation signal in response to the fuse program signal and an address validity signal. A fuse circuit is electrically programmed in response to the program activation signal, and a pull-down resistor is connected between the signal line and ground.

13 Claims, 5 Drawing Sheets

US 7,697,361 B2

APPARATUS FOR ELECTRICAL FUSE OPTION IN SEMICONDUCTOR INTEGRATED CIRCUIT

CROSS-REFERENCE TO RELATED APPLICATIONS

This U.S. non-provisional patent application claims priority under 35 U.S.C. §119 of Korean Patent Application No. 10-2006-0060987, filed on Jun. 30, 2006, the entire contents of which are hereby incorporated by reference.

BACKGROUND OF THE INVENTION

The present disclosure relates to a semiconductor integrated circuit, and more particularly, to a fuse option circuit of a semiconductor integrated circuit.

Generally, a fuse option circuit is used in a semiconductor integrated circuit for various purposes. For example, the fuse option circuit is widely used for storing chip identification (ID), repairing a defective semiconductor memory cell, and properly setting an internal voltage by trimming. Programming methods for a fuse option circuit can be classified into a laser blowing method and an electrical blowing method. In a laser blowing method a fuse is blown by irradiating the fuse with a laser. In an electrical blowing method, a fuse is electrically cut by applying a predetermined current to the fuse to change the resistance of the fuse. Particularly, the electrical blowing method can be used after a semiconductor chip is packaged. The electrical blowing method is also called an electrical fuse (eFUSE) method. An example of a fuse option circuit using an electrical fuse is disclosed in U.S. Pat. No. 6,498,526, entitled "FUSE CIRCUIT AND PROGRAM STATUS DETECTING METHOD THEREOF". However, when an electrical fuse (or "efuse") is used, it is difficult to determine whether the electrical fuse is cut, as compared with the case where a laser blowing method is used. Furthermore, when an uncut electrical fuse is programmed, the electrical fuse can be undesirably cut by an impact or noise after a packaging process. In addition, an electrical fuse can be undesirably programmed by a large current applied to the electrical fuse in a die sort test process, regardless of the existence of a programming command.

FIG. 1 is a sectional diagram illustrating a conventional semiconductor integrated circuit device 10 including an electrical fuse formed after a packaging process. Referring to FIG. 1, the packaged semiconductor integrated circuit device 10 includes metal pins for electric connection with external devices. PAD_0 through PAD_n of an integrated circuit die 20 are connected to Lead_0 through Lead_m through metal wires. The integrated circuit die 20 includes a fuse block 21. The fuse block 21 includes a plurality of efuses and other circuits used for fuse programming and reading. Generally, fuse programming is performed prior to a packaging process for storing a chip ID, repairing a defective cell, and trimming for analog circuits, for example. A fuse program is generally a one-off program. Therefore, after the PAD_2 is used to receive a fuse program signal PGM (or a fuse program command) for fuse programming, the PAD_2 in not used. In a packaging process, the PAD_2, which is not connected to a pin for electric connection with an external device, is packaged using an insulation material. That is, the PAD_2, which is formed to receive a fuse program signal PGM, is not connected to an external device after a packaging process. Therefore, a program signal line connected between the PAD_2 and the fuse block 21 remains in a floating state.

However, since a semiconductor integrated circuit is formed on a semiconductor substrate, signal lines of the semiconductor integrated circuit have a relatively large parasitic capacitance and thus store an undesired electric charge or couple to other signal lines. Therefore, the program signal line, which is connected between the PAD_2 and the fuse block 21 to transmit a fuse program signal PGM, has an undesired parasitic capacitance Cpra. Furthermore, the parasitic capacitance Cpra of the program signal line can couple with other adjacent signal lines, resulting in noise. In addition, an electric leakage charge can be stored in the program signal line because of the parasitic capacitance Cpra. For these reasons, the electric potential of the program signal line can be increased. When the electric potential of the program signal line is increased larger than a desirable level, the electric potential of the program signal line results in the same effect as a fuse program signal PGM. For example, a driver device (not shown) connected to an end of the program signal line can be turned on when the electric potential of the program signal line is increased by accumulated electric charge. That is, in a mounted semiconductor circuit device, a fuse can be undesirably programmed. Moreover, before a packaging process, a fuse can be programmed by a high voltage Vpp applied to the fuse block 21, even though a fuse program signal PGM (or a program command) is not input.

SUMMARY OF THE INVENTION

The present invention provides an electrical fuse circuit having stable programming characteristics.

In accordance with one aspect of the present invention, provided are fuse option apparatus in a semiconductor integrated circuit, the fuse option apparatus including: a pad receiving an external fuse program signal; a program signal driving circuit connected to the pad through a signal line and configured to generate a program activation signal in response to the fuse program signal and an address validity signal; a fuse circuit electrically programmable in response to the program activation signal; and a pull-down resistor connected between the signal line and ground.

The pad can be a non-bonding pad.

The program signal driving circuit can perform an AND logic calculation for the fuse program signal and the address validity signal.

The fuse circuit can include: an electrical fuse connected between an internal high voltage and a first node; and a fuse program NMOS transistor including a gate configured to receive the program activation signal, a drain connected to the first node, and a source connected to the ground.

The fuse option apparatus can further include a fuse sense amplifier circuit connected to the first node and configured to detect a program state of the electrical fuse and to output the detection result as fuse data.

The fuse option apparatus can further include a fuse address decoder configured to generate the address validity signal in response to an external address input.

The fuse option apparatus can further include a control logic configured to provide the external address input for the fuse address decoder in a fuse program mode.

The pull-down resistor can include an NMOS transistor, and the NMOS transistor can include a drain connected to the signal line, a source connected to the ground, and a control gate connected to a power supply voltage.

In accordance with another aspect of the present invention, there is provided a fuse option circuit in a semiconductor integrated circuit. The fuse option circuit includes: a non-bonding pad configured to receive an external fuse program signal; a program signal driving circuit connected to the non-bonding pad through a signal line and configured to generate a program activation signal in response to the fuse program signal and an address validity signal; an electrical fuse connected between an internal high voltage and a first node; a fuse program NMOS transistor including a gate configured to receive the program activation signal, a source connected to the first node, and a drain connected to ground; a fuse sense amplifier circuit connected to the first node and configured to detect whether the electrical fuse is programmed and to output the detection result as fuse data; and a pull-down resistor connected between the signal line and the ground.

The program signal driving circuit can be configured to perform an AND logic calculation for the fuse program signal and the address validity signal.

The fuse option circuit can further include a fuse address decoder configured to generate the address validity signal in response to an external address input.

The fuse option circuit can further include a control logic configured to provide the external address input for the fuse address decoder in a fuse program mode.

The pull-down resistor can include an NMOS transistor, and the NMOS transistor can include a drain connected to the signal line, a source connected to the ground, and a control gate connected to a power supply voltage.

According to the present invention, in the fuse option device of a semiconductor integrated circuit, undesired programming of the electrical fuse can be prevented by the pull-down resistor connected to the pad or signal line through which a fuse program signal is transmitted.

BRIEF DESCRIPTION OF THE FIGURES

The drawings illustrate exemplary embodiments of the present invention and, together with the description, serve to explain aspects of the present invention. In the figures.

DETAILED DESCRIPTION OF PREFERRED EMBODIMENTS

Preferred embodiments of the present invention will be described below with reference to the accompanying drawings. The present invention can, however, be embodied in different forms and should not be constructed as limited to the embodiments set forth herein.

It will be understood that, although the terms first, second, etc. may be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Figure 2:
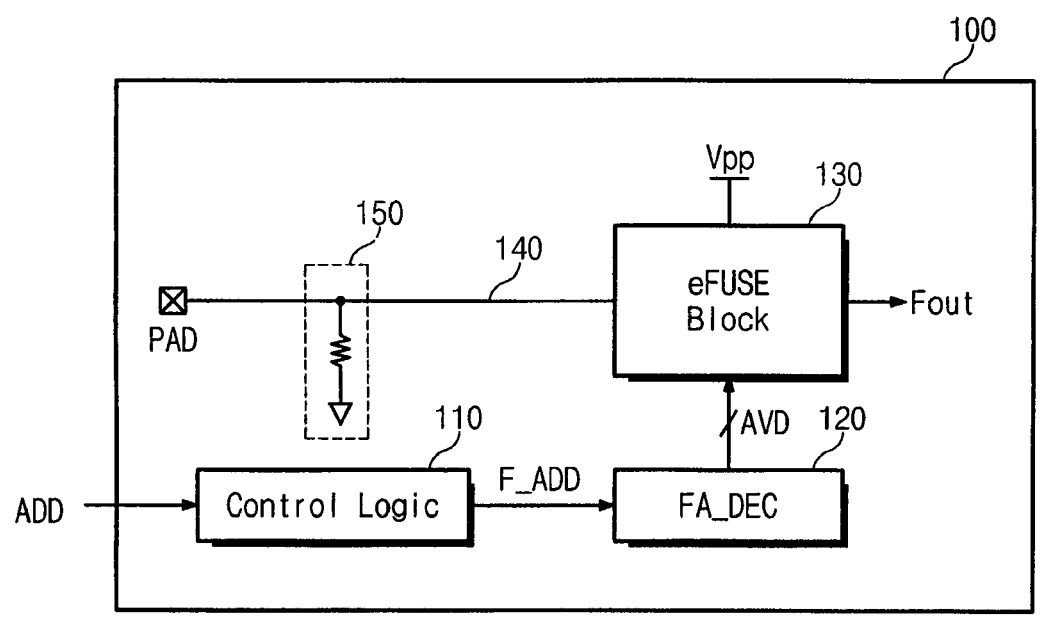
FIG. 2 is a block diagram schematically illustrating an electrical fuse circuit according to an embodiment of the present invention.

FIG. 2 illustrates an embodiment of the present invention. Referring to FIG. 2, a fuse option circuit 100 of the present invention includes a signal line 140 and a pull-down resistor 150. The signal line 140 electrically connects a fuse block 130 to a pad that receives a fuse program signal PGM, and the pull-down resistor 150 connects the signal line 140 to the ground.

A control logic 110 provides an address ADD of a fuse to be programmed in test mode. Generally, automatic test equipment (ATE) provides an address ADD of a fuse to be programmed. An address ADD is input to the control logic 110 under the control of the ATE, and the control logic 110 provides the address ADD to a fuse address decoder 120 as a fuse address F_ADD for fuse programming. The control logic 110 provides a fuse address F_ADD for selecting a fuse when a fuse programming is executed. Furthermore, the control logic 110 can provide addresses for other components in other operations. For example, it is apparent to those of skill in the related art that the control logic 110 can deliver an address ADD that is input as an address of an SRAM or a register.

The fuse address decoder 120 selects fuse cells to be programmed or not to be programmed using the fuse address F_ADD. The fuse address decoder 120 decodes the fuse address F_ADD to generate an address validity signal AVD for selecting each fuse cell to be programmed.

The fuse block 130 includes a plurality of electrical fuses (eFUSEs) each to be selected according to a fuse program signal PGM and the address validity signal AVD. The address validity signal AVD is generated corresponding to the bit number of an electrical fuse of the fuse block 130 to he programmed. When N fuses are to be programmed, N lines of address validity signals AVDs are selectively activated. N fuse cells are programmed (or cut) according to logic levels of the address validity signals AVDs. An internally boosted high voltage Vpp is used as a programming power source to program a fuse cell by applying a large current to the fuse cell. After a fuse programmed according to the above-described method, the fuse provides fuse data Fout in actual operational environment. The fuse data Fout can be used for an integrated circuit as initialization information, defective cell repair information, and/or chip ID information, as examples.

The signal line 140 can be formed of polysilicon or metal for electrically connecting the pad and the fuse block 130. The pad receives a fuse program signal PGM from the ATE and is electrically disconnected from an outside device after a packaging process. Therefore, the signal line 140 connected between the pad and the fuse block 130 remains in a non-specified floating state after the packaging process. As described above, the signal line 140 has a parasitic capacitance in association with neighboring lines and ground potential. An electric charge accumulated by the parasitic capacitance can increase the electric potential of the signal line 140. When the electric potential of the signal line 140 is increased to a certain level (e.g., VDD/2), the electric potential of the signal line 140 affects the fuse block 130 in the same manner as a fuse program signal PGM applied to the fuse block 130 in test mode. When the signal line 140 and a line for the address validity signal AVD are both increased in electric potential due to such coupling, an electrical fuse can be programmed in an undesired manner. Moreover, this problem can occur even before a packaging process. That is, when an external terminal is not connected to the pad to input a fuse program signal PGM and the signal line 140 is in a floating state, an electrical fuse can be undesirably programmed even before a packaging process.

The above-described unstable state of an electrical fuse can be solved by the pull-down resistor 150. The signal line 140 for transmitting a fuse program signal PGM is grounded by the pull-down resistor 150, such that an electric charge accumulated in the signal line 140 can be discharged. The pull-down resistor 150 discharges the signal line 140 such that the electric potential of the signal line 140 can be prevented from being steeply increased by coupling. Thus, the electric potential of the signal line 140 can be maintained at a substantially constant level. The pull-down resistor 150 can protect the fuse block 130 from undesired influences caused by other than a fuse program signal PGM input to the pad. Therefore, fuse data Fout programmed in the fuse block 130 can be more reliable.

In the fuse option circuit 100 of the current embodiment, the signal line 140 can be stabilized by the pull-down resistor 150 so that undesired programming of electrical fuses can be prevented. Therefore, reliable fuse data can be provided.

Figure 1:
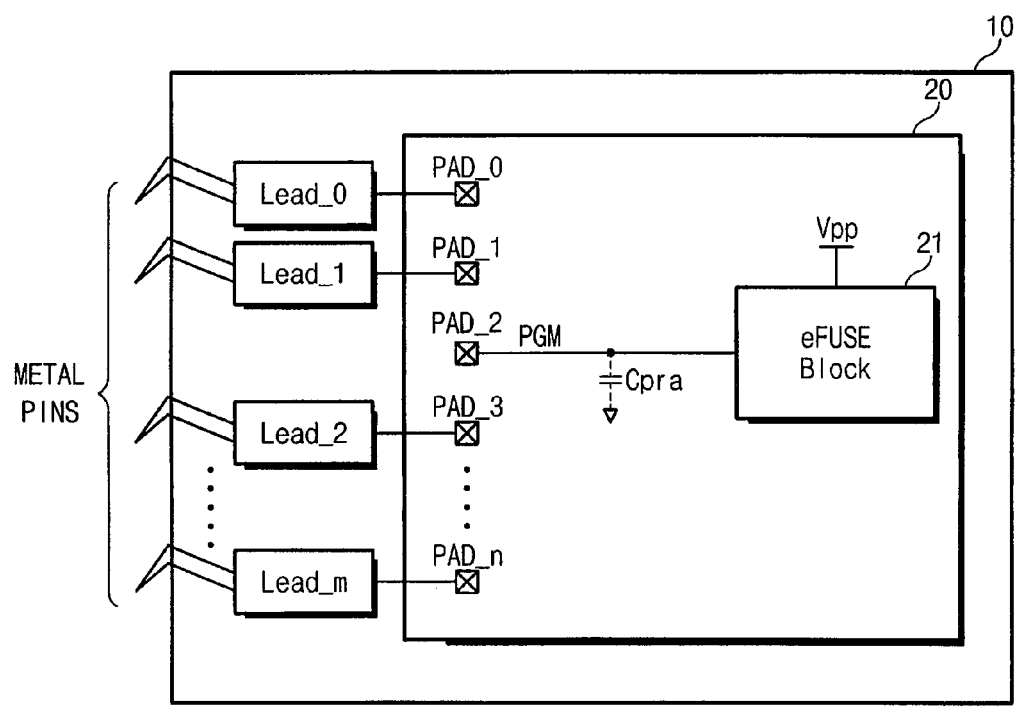
FIG. 1 is a sectional diagram illustrating a prior art semiconductor integrated circuit package including an electrical fuse circuit.
Figure 3:
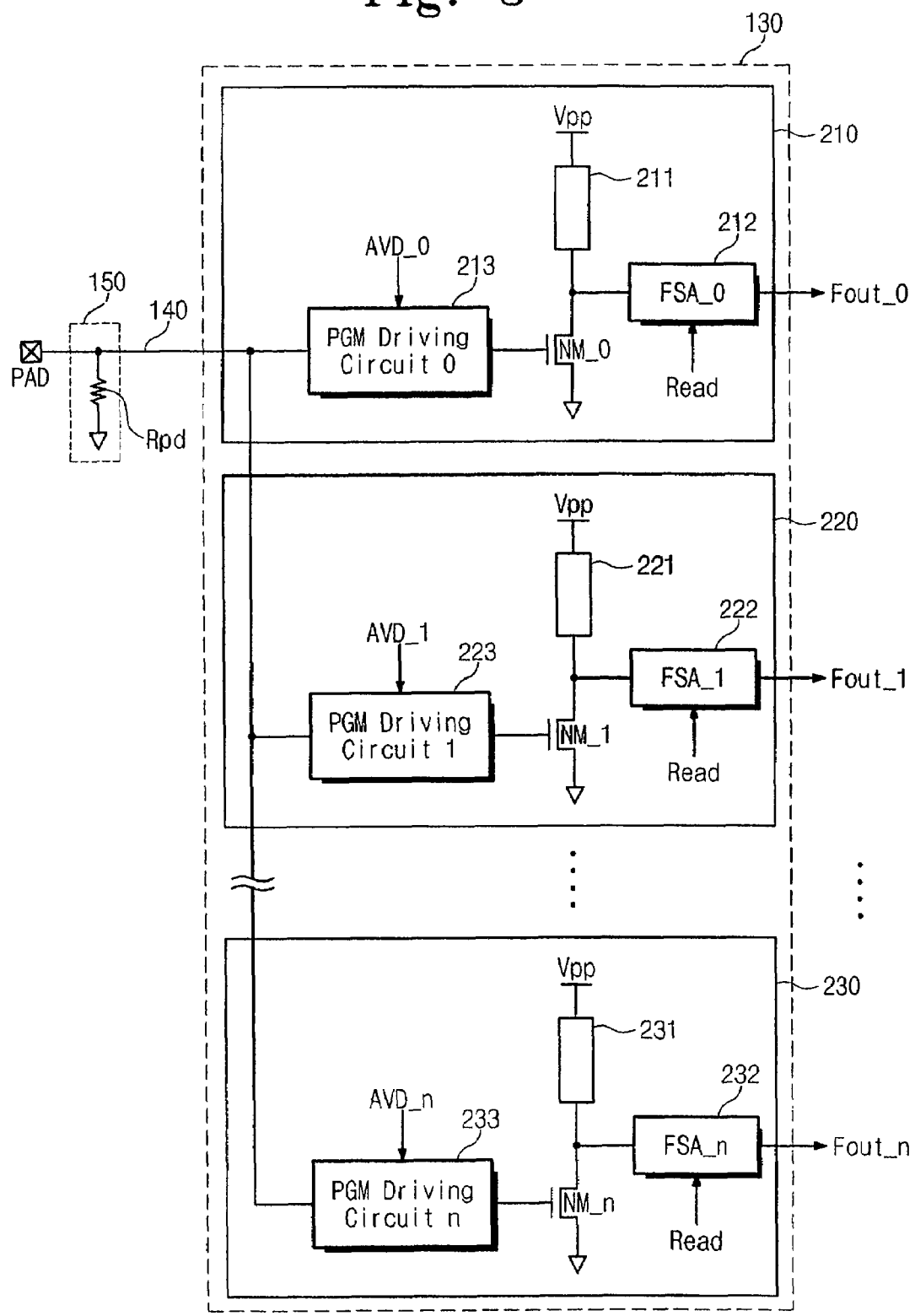
FIG. 3 is a block diagram schematically illustrating a fuse block of the electrical fuse circuit depicted in FIG. 2, according to an embodiment of the present invention.

FIG. 3 is a circuit diagram schematically illustrating the pull-down resistor 150 and the Fuse block 130 of FIG. 2. Referring to FIG. 3, the signal line 140 is connected from the pad receiving a fuse program signal PGM to program signal driving circuits 213, 223, and 233 of fuse units 210, 220, and 230. The pull-down resistor 150 is connected between the signal line 140 and the ground. The electrical potential of the signal line 140 is not increased by any reason except for a fuse program signal PGM input from the pad. In FIGS. 1 and 2, like reference numerals denote like elements.

The fuse block 130 includes the fuse units 210, 220, and 230, each receiving a fuse program signal PGM. The fuse units 210, 220, and 230 include electrical fuses 211, 221, and 231, respectively, for programming data. The fuse units 210, 220, and 230 also include the program signal driving circuits 213, 223, and 233 for programming data into the electrical fuses 211, 221, and 231. The fuse units 210, 220, and 230 further include fuse sense amplifier (FSA) circuits 212, 222, and 232 for outputting of the data programmed into the electrical fuses 211, 221, and 231. The fuse block 130 includes a plurality of fuse units, and one-bit data can be stored in each of the fuse units. Here, the fuse block 130 includes as many fuse units as the number of programmable bits. The signal line 140 is connected to all fuse units of the fuse block 130. For example, the signal line 140 is connected to the program signal driving circuits 213, 223, and 233 of the fuse units 210, 220, and 230.

When only one of the program signal driving circuits 213, 223, and 233 is activated, a corresponding electrical fuse is programmed even though a fuse program signal PGM is not input. This means that a semiconductor device is defective. If any bit of fuse data Fout_0 through Fout_n is incorrectly set during an initialization operation or chip ID reading operation, a system can malfunction fatally. Therefore, the potential level stability of the signal line 140 is important. If such an error occurs in actual operational environment, a fatal system error can occur. This undesired fuse programming occurs when the electric potential of the signal line 140 is increased by noise and line-coupling. It is difficult to repair the fuse block 130 even when only one of the electrical fuses 211, 222, and 232 is incorrectly programmed.

However, in the present invention, the pull-down resistor 150 is connected to the signal line 140 to prevent such undesirable fuse programming. The signal line 140 can be stabilized in this way. Thus, regardless of the levels of address validity signals AVD_0 through AVD_n, the program signal driving circuits 213, 223, and 233 can turn off NMOS transistors NM_0 through NM_n used for fuse programming.

Figure 4:
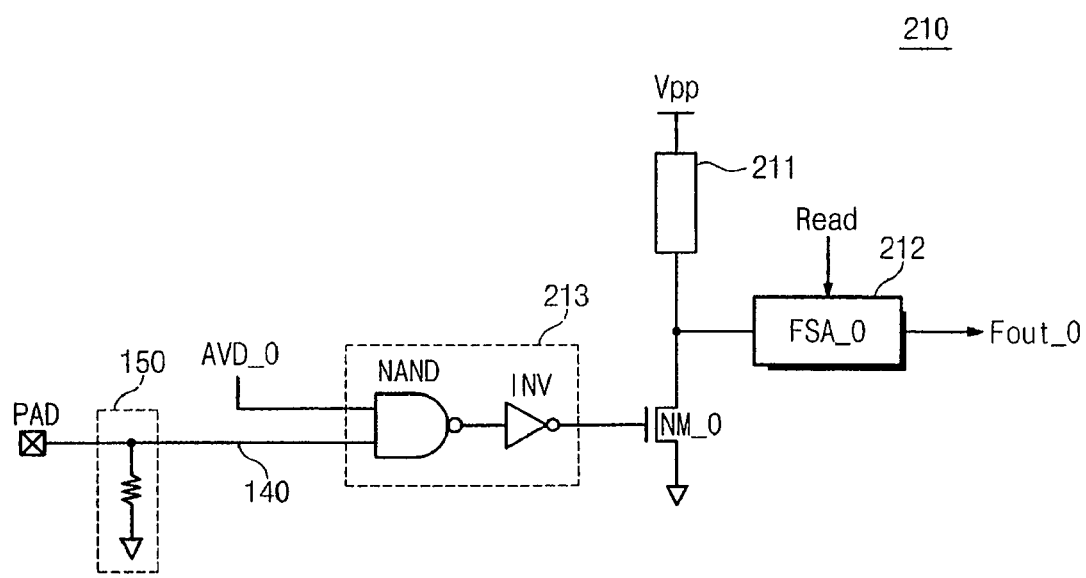
FIG. 4 is a block diagram schematically illustrating a fuse unit of the fuse block depicted in FIG. 3, according to an embodiment of the present invention.

FIG. 4 is a block diagram schematically illustrating an embodiment of the fuse unit 210 of the fuse block 130 depicted in FIG. 3, according to aspects of the present invention. Referring to FIG. 4, the fuse unit 210 is connected to the pad, and a fuse program signal PGM is input to the pad in test mode. Specifically, the program signal driving circuit 213 of the fuse unit 210 is electrically connected to the signal line 140. The program signal driving circuit 213 maintains the programmed or non-programmed state of the electrical fuse 211 by switching on or off the fuse program NMOS transistor NM_0. The fuse sense amplifier circuit 212 detects the program state of the electrical fuse 211 and outputs the detection result as fuse data Fout_0 in response to a Read command.

Here, the program signal driving circuit 213 is functionally equivalent to the logic of an AND gate. Therefore, both the fuse program signal PGM and the address validity signal AVD_0 should be logic [1] to turn on the fuse program NMOS transistor NM_0. However, both the electric potentials of signal lines, through which the fuse program signal PGM and the address validity signal AVD_0 are respectively input, can be increased to a level corresponding to a logic [1] due to coupling or electric charge accumulation. In this case, although a fuse program signal PGM is not input, the fuse program NMOS transistor NM_0 is turned on, and thus a large current is applied to the electrical fuse 211 to program the electrical fuse 211. When the electrical fuse 211 is already programmed in a test process, such undesired programming does not cause any problem. However, when the electrical fuse 211 is not programmed in a test process, such undesired programming causes a fatal problem. Generally, a fuse is an on-off program device. Thus, once a fuse is incorrectly programmed, it is impossible to repair the fuse. However, the pull-down resistor 150 prevents the floating-state signal line 140 from being abnormally increased in electric potential. Undesired programming of the electrical fuse 211 can be prevented by preventing only one of the two input signal lines of the program signal driving circuit 213 from being abnormally increased in electric charge.

Figure 5:
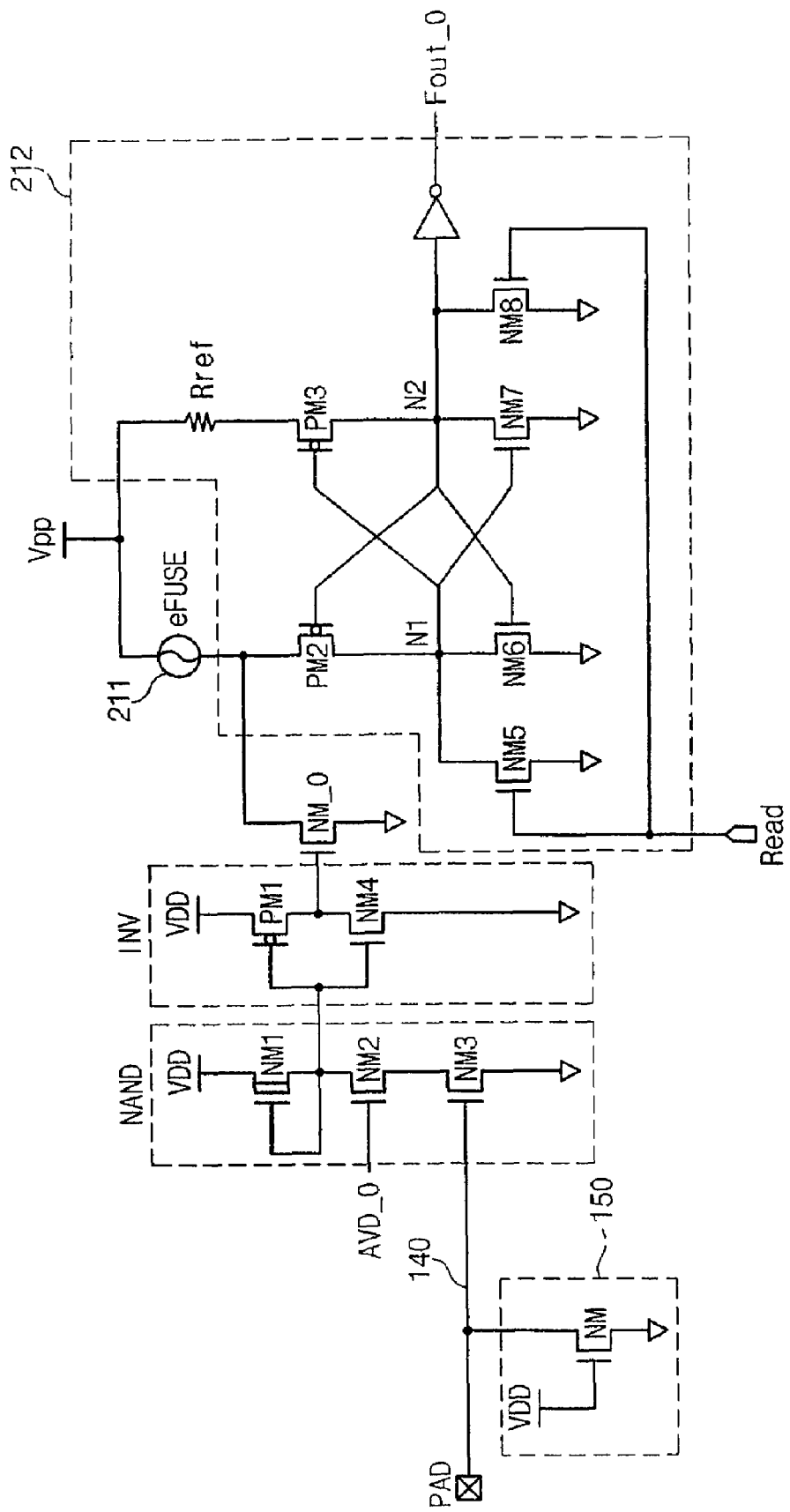
FIG. 5 is a circuit diagram of the fuse unit depicted in FIG. 4, according to an embodiment of the present invention.

FIG. 5 is a detailed circuit diagram of the fuse unit depicted in FIG. 4, according to an embodiment of the present invention. Referring to FIG. 5, the signal line 140, which remains in a floating state after a packaging process, is kept in a stable electric potential by the pull-down resistor 150. Therefore, although coupling occurs at a signal line path through which an address activation signal AVD_0 is transmitted, the output of a NAND gate can be kept at a high level. This condition can be kept if the electrical fuse 211 is not blown or changed into a high-resistance state by a large current applied to the electrical fuse 211 in a fuse program process.

The NAND gate can be made up of conventional NMOS transistors, for example. A drain of a depletion-type NMOS transistor NM1 is connected to a power supply voltage, and a source of the depletion-type NMOS transistor NM1 is used as an output terminal of the NAND gate. A gate of the depletion-type NMOS transistor NM1 is connected to the output terminal. An address activation signal AVD_0 is transmitted to a gate of a NMOS transistor NM2, and the signal line 140 is connected to a gate of a NMOS transistor NM3. The NMOS transistors NM2 and NM3 are connected in series between the output terminal and ground. Therefore, when the address activation signal AVD_0 and the signal line 140 are not both at a high level, the output of the NAND gate can be kept at a high level.

An inverter INV can be made up of CMOS devices that are widely used in a digital circuit. Gates of a PMOS transistor PM1 and an NMOS transistor NM4 of the inverter INV are connected to the output terminal of the NAND gate. The inverter INV inverts the level of the output of the NAND gate and then transmits the output to a gate of a fuse program NMOS transistor NM_0. At the moment when a high-level output of the inverter INV is input to the gate of the fuse program NMOS transistor NM_0, a large current is applied to the electrical fuse 211 by a high voltage Vpp and thus the electrical fuse 211 is programmed.

Generally, the electrical fuse 211 is formed of a material that has a high resistance when programmed. Therefore, after the programming, the resistance of the electrical fuse 211 increases. The fuse sense amplifier circuit 212 detects a variation of the resistance of the electrical fuse 211 and determines from the detection whether the electrical fuse 211 is programmed. Then, the fuse sense amplifier circuit 212 outputs fuse data Fout_0 as a result of the detection. Here, it is set such that the resistance of the electrical fuse 211 is larger than a reference resistance Rref of the fuse sense amplifier circuit 212 after the electrical fuse 211 is programmed.

The fuse sense amplifier circuit 212 detects whether the electrical fuse 211 is programmed in response to a read command Read and output fuse date Fout_0 as a result of the detection. When a read command Read is input, NMOS transistors NM5 and NM8 are turned on, and first and second nodes N1 and N2 are set to a ground potential level. Then, PMOS transistors PM2 and PM3 are turned on, and NMOS transistors NM6 and NM7 are turned off. When the electrical fuse 211 is not programmed (i.e., the resistance of the electrical fuse 211 is lower than the reference resistance Rref), the electric potential of the first node N1 is higher than that of the second node N2, since more current is applied by a power supply. That is, the second node N2 is set to a ground potential level, and the first node N1 is set to a high potential level. Thus, the fuse data Fout_0 is output as a logic [1]. On the other hand, when the electrical fuse 211 is programmed (i.e., the resistance of the electrical fuse 211 is higher than the reference resistance Rref), the electric potential of the first node N1 is lower than that of the second node N2. That is, the second node N2 is at a high potential level, and the first node N1 is at a low potential level corresponding to the ground level. Thus, the fuse data Fout_0 is output as a logic [0].

The pull-down resistor 150 is formed between the signal line 140 and ground. In the current embodiment, the pull-down resistor 150 is formed using an NMOS transistor NM. When a fuse program signal PGM is input to the pad, a voltage drop can occur at the signal line 140 due to the pull-down resistor 150. Thus, the resistance of the pull-down resistor 150 is designed not to block the fuse program signal PGM. Furthermore, an electric charge can be accumulated in the signal line 140 to increase the electric potential of the signal line 140 although a fuse program signal PGM is not input after a packaging process. Thus, the pull-down resistor 150 is designed to minimize the effect of such electric charge accumulation and coupling. That is, the resistance of the pull-down resistor 150 is designed in consideration of the trade-off between a voltage drop arising when a fuse program signal PGM is input and an increase of a electric potential of the signal line 140 caused by electric charge accumulation and coupling. The resistance of the pull-down resistor 150 can be adjusted by varying the aspect ratio L/W of the NMOS transistor NM. This adjustment method is well known to those of skill in the related art, so not described in detail herein. Although the pull-down resistor 150 is formed using the NMOS transistor in the current embodiment, the pull-down resistor 150 can be formed using other devices.

Some of the advantages of using the pull-down resistor 150 to increase the reliability of the signal line 140 will now be described in consideration of conditions after and before a packaging process. Before a packaging process, die-level tests can be performed on a chip including the fuse option circuit of the present invention. For example, when a high-voltage test signal is input in a burn-in test, a fuse program is not activated by coupling or an electric shock owing to the pull-down resistor 150. Furthermore, although a sequence of applying a fuse program signal PGM, an internal voltage VDD, and an internal high voltage Vpp should be precisely controlled to prevent fuse program errors in a related-art process, it is not necessary to precisely control the application sequence owing to the reliability improved by the pull-down resistor 150.

After a packaging process, the pad and the signal line 140 are kept in a floating state. However, since the pull-down resistor 150 can discharge the signal line 140, the signal line 140 can be reliably kept at a logic level of [0] although coupling and electric shocks occurs. Therefore, desired fuse data Fout can be obtained even under extreme conditions of noise and temperature.

According to the present invention, yield can be increased in semiconductor fabrication using the pull-down resistor 150, and fuse data can be stably obtained in an actual operating environment.

As described above, according to the present invention, the fuse option device for a semiconductor integrated circuit includes the pull-down resistor connected to a pad or a signal line to which a signal is input for activating a fuse program, so that undesired fuse programming can be prevented. Furthermore, it is not necessary to connect the pad using a pin in a packaging process, so that the number of pins of a semiconductor device can be reduced. Moreover, the present invention can provide a reliable semiconductor integrated circuit from which stable fuse data can be obtained.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A fuse option apparatus in a semiconductor integrated circuit, the fuse option apparatus comprising:

a pad configured to receive an external fuse program signal;

a program signal driving circuit connected to the pad through a signal line and configured to generate a program activation signal in response to the fuse program signal and an address validity signal;

a fuse circuit electrically programmable in response to the program activation signal; and a pull-down resistor connected between the signal line and ground.

2. The fuse option apparatus of claim 1, wherein the pad is a non-bonding pad.

3. The fuse option apparatus of claim 1, wherein the program signal driving circuit is configured to perform an AND logic calculation for the fuse program signal and the address validity signal.

4. The fuse option apparatus of claim 1, wherein the fuse circuit comprises:

an electrical fuse connected between an internal high voltage and a first node; and a fuse program NMOS transistor including a gate configured to receive the program activation signal, a drain connected to the first node, and a source connected to the ground.

5. The fuse option apparatus of claim 4, further comprising a fuse sense amplifier circuit connected to the first node and configured to detect a program state of the electrical fuse and to output the detection result as fuse data.

6. The fuse option apparatus of claim 1, further comprising a fuse address decoder configured to the address validity signal in response to an external address input.

7. The fuse option apparatus of claim 6, further comprising a control logic configured to provide the external address input for the fuse address decoder in a fuse program mode.

8. The fuse option apparatus of claim 1, wherein the pull-down resistor comprises an NMOS transistor, the NMOS transistor includes a drain connected to the signal line, a source connected to the ground, and a control gate connected to a power supply voltage.

9. A fuse option circuit in a semiconductor integrated circuit, the fuse option circuit comprising:

a non-bonding pad configured to receive an external fuse program signal;

a program signal driving circuit connected to the non-bonding pad through a signal line and configured to generate a program activation signal in response to the fuse program signal and an address validity signal;

an electrical fuse connected between an internal high voltage and a first node;

a fuse program NMOS transistor including a gate configured to receive the program activation signal, a source connected to the first node, and a drain connected to ground;

a fuse sense amplifier circuit connected to the first node and configured to detect whether the electrical fuse is programmed and to output the detection result as fuse data; and a pull-down resistor connected between the signal line and the ground.

10. The fuse option circuit of claim 9, wherein the program signal driving circuit is configured to perform an AND logic calculation for the fuse program signal and the address validity signal.

11. The fuse option circuit of claim 9, further comprising a fuse address decoder configured to generate the address validity signal in response to an external address input.

12. The fuse option circuit of claim 11, further comprising a control logic configured to provide the external address input for the fuse address decoder in a fuse program mode.

13. The fuse option circuit of claim 10, wherein the pull-down resistor comprises an NMOS transistor, the NMOS transistor including a drain connected to the signal line, a source connected to the ground, and a control gate connected to a power supply voltage.

* * * * *